(12) United States Patent
Maeda et al.

(10) Patent No.: US 9,571,110 B2
(45) Date of Patent: Feb. 14, 2017

(54) DELAY CIRCUIT, DELAY LOCKED LOOP CIRCUIT INCLUDING DELAY CIRCUIT AND PROCESSOR INCLUDING DELAY LOCKED LOOP CIRCUIT

(71) Applicant: FUJITSU LIMITED, Kawasaki-shi, Kanagawa (JP)

(72) Inventors: Masazumi Maeda, Yokohama (JP); Yoshiharu Yoshizawa, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 7 days.

(21) Appl. No.: 14/835,769

(22) Filed: Aug. 26, 2015

(65) Prior Publication Data

US 2016/0105189 A1 Apr. 14, 2016

(30) Foreign Application Priority Data

Oct. 10, 2014 (JP) .................... 2014-208624

(51) Int. Cl.
| | |
|---|---|
| H03L 7/06 | (2006.01) |
| H03L 7/095 | (2006.01) |
| H03K 5/134 | (2014.01) |
| H03L 7/081 | (2006.01) |
| H03K 5/00 | (2006.01) |

(52) U.S. Cl.
CPC .............. *H03L 7/095* (2013.01); *H03K 5/134* (2014.07); *H03L 7/0818* (2013.01); *H03K 2005/00019* (2013.01)

(58) Field of Classification Search
USPC .............. 327/2–12, 105–123, 141, 144–163, 327/530–546; 323/312–317; 331/15–17; 375/373–376
See application file for complete search history.

(56) References Cited

U.S. PATENT DOCUMENTS

| | | | | |
|---|---|---|---|---|
| 6,867,627 B1 * | 3/2005 | Murtagh | ............... | H03L 7/0812 327/149 |
| 7,129,800 B2 * | 10/2006 | Gauthier | .......... | G01R 31/31727 327/156 |
| 2002/0017939 A1 | 2/2002 | Okuda et al. | | |
| 2002/0180500 A1 | 12/2002 | Okuda et al. | | |
| 2003/0155955 A1 | 8/2003 | Andrasic et al. | | |
| 2004/0125905 A1 * | 7/2004 | Vlasenko | .............. | H03L 7/0814 375/376 |

(Continued)

FOREIGN PATENT DOCUMENTS

| | | |
|---|---|---|
| JP | 10-079663 | 3/1998 |
| JP | 2002-043934 | 2/2002 |
| JP | 2003-179470 | 6/2003 |

*Primary Examiner* — Brandon S Cole
(74) *Attorney, Agent, or Firm* — Fujitsu Patent Center

(57) ABSTRACT

A delay circuit comprises a plurality of delay buffers each including two or more serially connected delay units, each of the delay units being capable of variably controlling a delay amount; a variable control voltage generator circuit configured to supply, to a first delay unit included in each of the plurality of delay buffers, a variable control voltage provided to control the delay amount of the first delay unit; and a fixed control voltage generator circuit configured to supply, to a second delay unit included in each of the plurality of delay buffers, a fixed control voltage among a plurality of fixed control voltages for controlling the delay amount of the second delay unit. The plurality of delay buffers are connected in series and an input signal propagates through the plurality of serially connected delay buffers.

8 Claims, 19 Drawing Sheets

(56) References Cited

U.S. PATENT DOCUMENTS

| | | |
|---|---|---|
| 2005/0024158 A1 | 2/2005 | Andrasic et al. |
| 2007/0024331 A1* | 2/2007 | Lin .................. G11C 7/20 |
| | | 327/141 |
| 2009/0140783 A1* | 6/2009 | Ishikawa ............. H03K 5/133 |
| | | 327/158 |

* cited by examiner

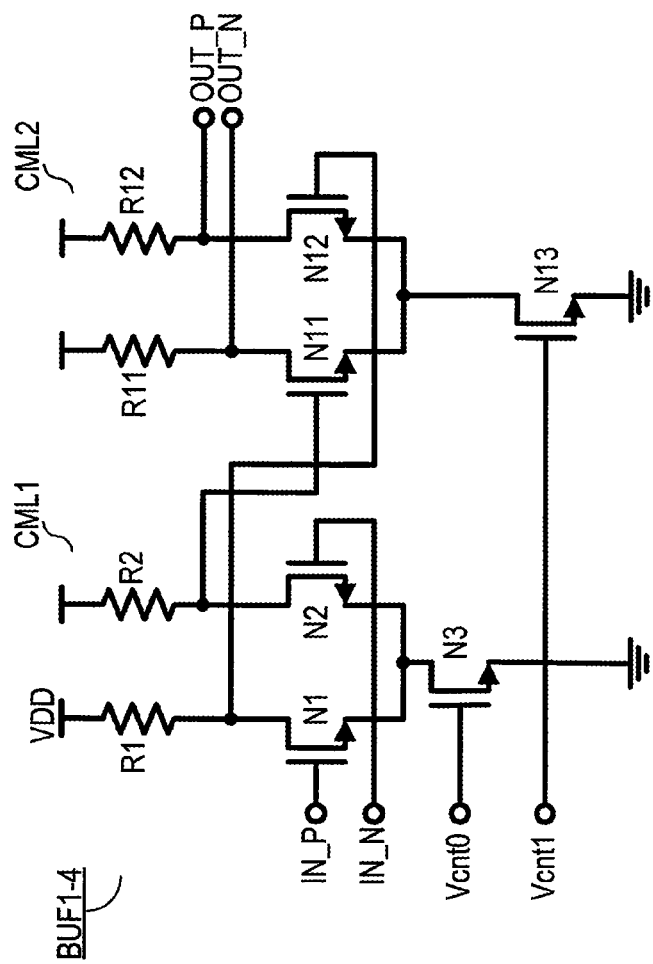
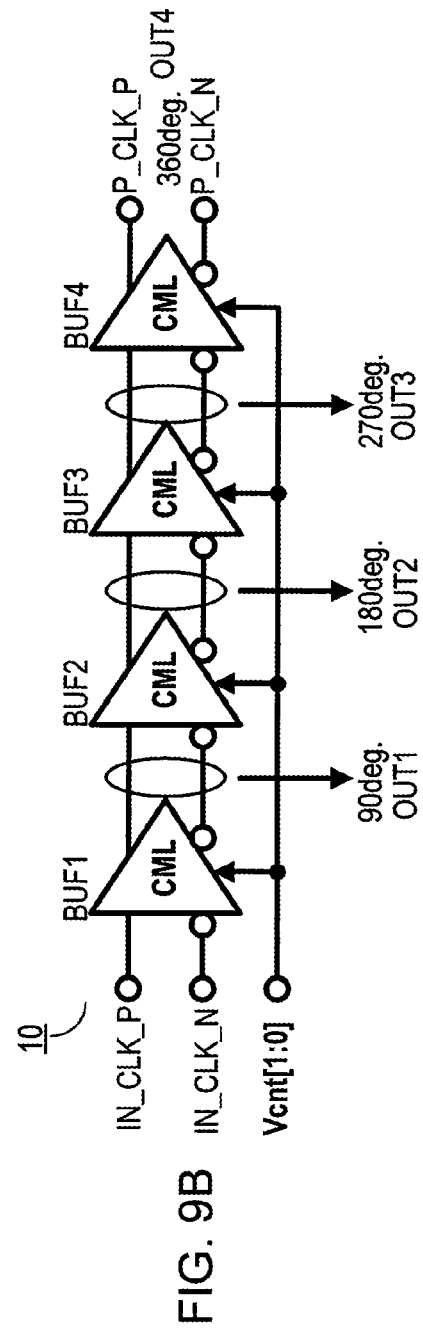
FIG. 9A
FIG. 9B

DELAY CIRCUIT, DELAY LOCKED LOOP CIRCUIT INCLUDING DELAY CIRCUIT AND PROCESSOR INCLUDING DELAY LOCKED LOOP CIRCUIT

CROSS-REFERENCE TO RELATED APPLICATION

This application is based upon and claims the benefit of priority of the prior Japanese Patent Application No. 2014-208624, filed on Oct. 10, 2014, the entire contents of which are incorporated herein by reference.

FIELD

The present invention relates to a delay circuit, a delay locked loop circuit including the delay circuit and a processor including the delay locked loop circuit.

BACKGROUND

A delay locked loop circuit (DLL: Delay Locked Loop) generates a multi-phase clock synchronized in phase with an input clock. The DLL includes: a delay circuit capable of variably controlling a delay time which is a propagation time of the input clock; a phase comparator which compares the phase of a propagation clock propagated through the delay circuit with the phase of the input clock, to output a signal corresponding to the phase difference; a charge pump which generates either a charge current or a discharge current according to the output of the phase comparator; and a capacitor which is charged or discharged by the current of the charge pump. The voltage of the capacitor is fed back to the delay circuit as a control voltage for the delay circuit.

In the DLL, when synchronized in phase, a propagation clock propagated through the delay circuit is delayed for one period (360°) from the input clock. Therefore, N delay buffers constituting the delay circuit generates multi-phase clocks of which phases are 1 to N-times of 360°/N of the input clock, respectively.

In the patent literatures of Japanese Laid-open Patent Publication No. Hei-10 (1998)-79663 and Japanese Laid-open Patent Publication No. 2002-43934, descriptions are given on the DLL. Also, a description is given on the PLL in the patent literature Japanese Laid-open Patent Publication No. 2003-179470.

As described above, in the DLL, the delay circuit delays the input clock for one period thereof. Therefore, the delay amount of the delay circuit is needed to be differentiated when the input clock frequency differs.

However, there is a demand that a high-speed transmission system using the DLL be operable through a wide range of a transmission rate to be compatible, from a legacy low-speed transmission system of around Gbps to a high-speed transmission system of several Gbps. Therefore, the delay circuit in the DLL is also demanded to be compatible with a wide frequency range.

SUMMARY

One aspect of the embodiments is a delay circuit comprising: a plurality of delay buffers each including two or more serially connected delay units, each of the delay units being capable of variably controlling a delay amount; a variable control voltage generator circuit configured to supply, to a first delay unit included in each of the plurality of delay buffers, a variable control voltage provided to control the delay amount of the first delay unit; and a fixed control voltage generator circuit configured to supply, to a second delay unit included in each of the plurality of delay buffers, a fixed control voltage among a plurality of fixed control voltages for controlling the delay amount of the second delay unit, wherein the plurality of delay buffers are connected in series, and an input signal propagates through the plurality of serially connected delay buffers.

According to the one aspect, it becomes possible to be compatible with a wideband clock.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIGS. 9A, 9B are diagrams illustrating another delay circuit according to the present embodiment.

DESCRIPTION OF EMBODIMENTS

Figure 1:
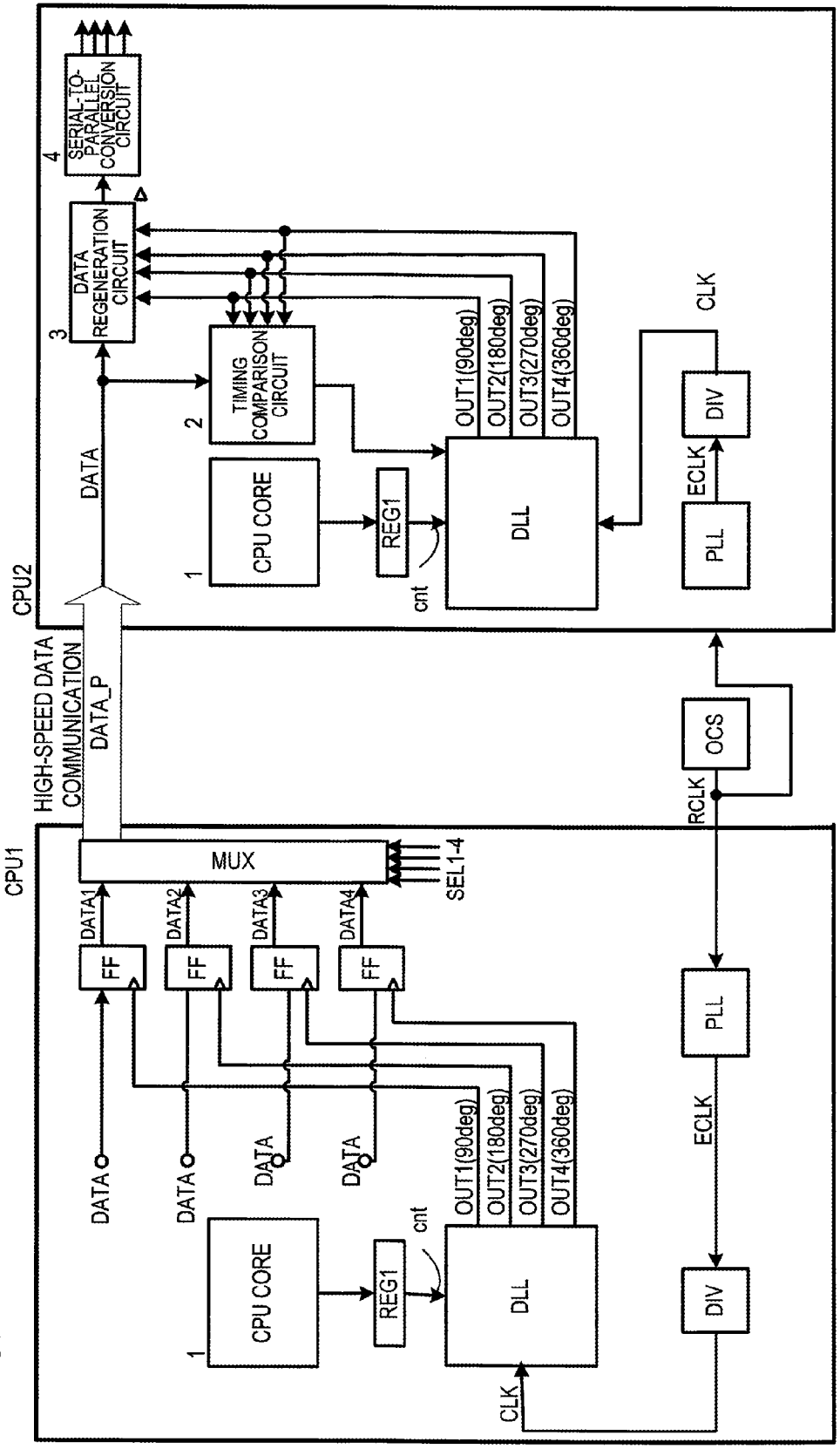
FIG. 1 is a diagram illustrating a configuration in which a high-speed transmission system is disposed between processors each including a DLL according to the present embodiment.

FIG. 1 is a diagram illustrating a configuration in which a high-speed transmission system is disposed between processors each including a DLL according to the present embodiment. In FIG. 1, a first processor CPU 1 and a second processor CPU 2 are depicted. In FIG. 1, high-speed data communication is performed between the first processor CPU 1 and the second processor CPU 2. Each of the two processors includes a PLL which, by inputting a reference clock RCLK generated by an oscillator OSC of high oscillation accuracy such as an external crystal oscillator, generates a clock ECLK which is synchronized with the reference clock RCLK in phase and multiplied in frequency. Each internal circuit (not illustrated) of the processors CPU 1, CPU 2 perform individual operation in synchronization with the above clock ECLK.

The first processor CPU 1 outputs to the second processor CPU2 a data signal DATA, generated in synchronization with the clock ECLK, through high-speed data communication DATA_P. Then, the second processor CPU 2 latches the received data signal DATA to transfer to the internal circuit.

Figure 2:
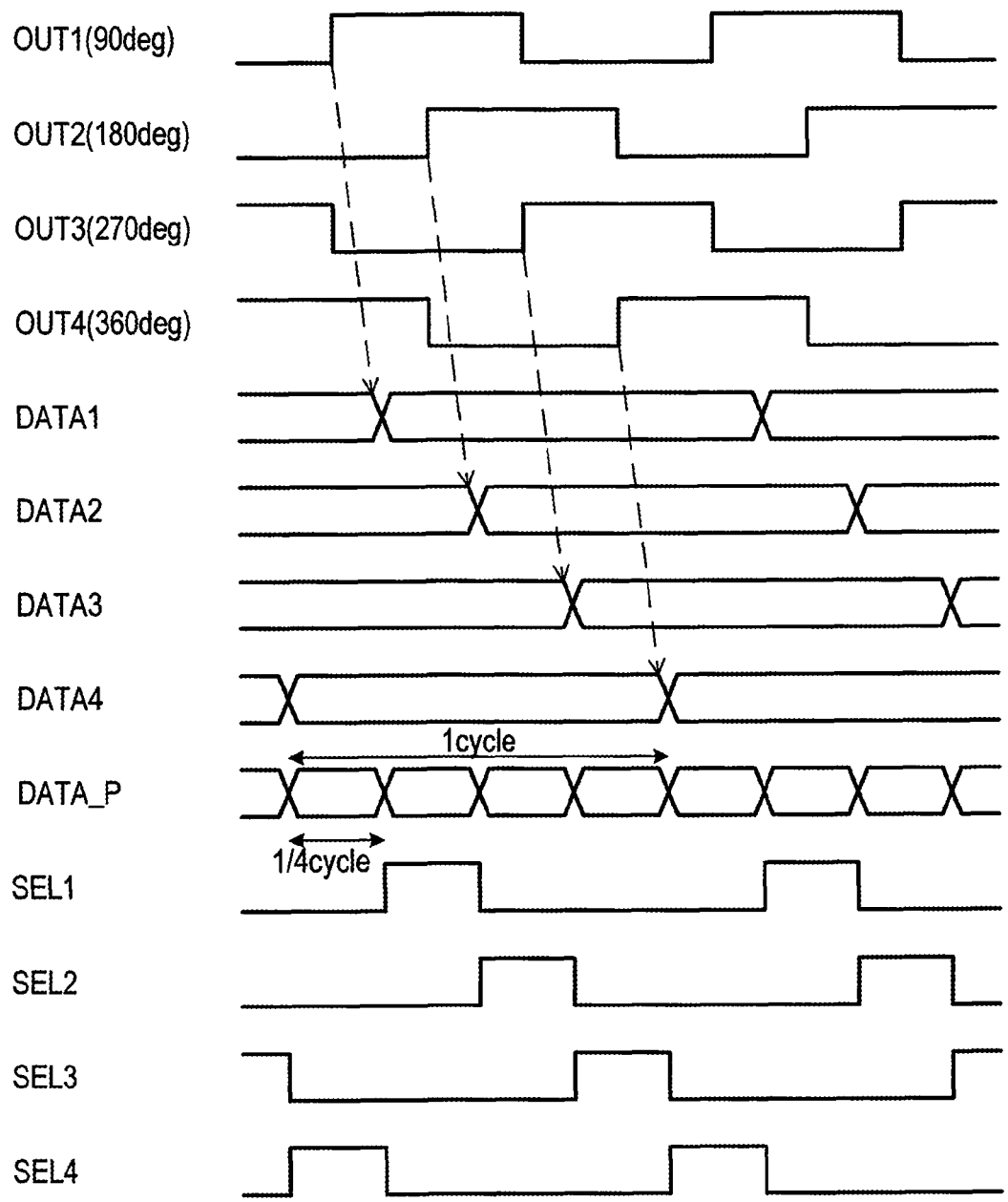
FIG. 2 is a diagram illustrating a timing chart for explaining high-speed data communication between the processors.

FIG. 2 is a diagram illustrating a timing chart for explaining high-speed data communication between the processors. The high-speed data communication between the processors of FIG. 1 will be explained below by reference to FIG. 2. First, the first processor CPU 1 includes a frequency divider DIV which frequency-divides the clock ECLK to generate a clock CLK. Further, four latch circuits FF latch four parallel data signals DATA respectively in synchronization with multi-phase clocks OUT1-4 which are different in phase and synchronized with the clock CLK. The above multi-phase clocks OUT1-4 which are different in phase are generated by a delay locked loop circuit DLL. The multi-phase clocks OUT1-4 include phases shifted by 90°, 180°, 270° and 360° from the phase of the clock CLK, respectively. Further, a multiplexer MUX performs parallel-to-serial conversion of the latched data DATA1-4 in synchronization with selection signals SEL1-4, to forward a converted data signal DATA_P to the second processor CPU 2. The selection signals SEL1-4 are timing signals which are generated in consideration of each delay time of the four latch circuits FF. Then, the forwarded data signal DATA_P is transmitted to the second processor CPU 2 through high-speed data communication.

Similarly, the second processor CPU 2 includes a PLL, a frequency divider DIV and a DLL. In the second processor CPU 2, a timing comparison circuit 2 compares the change timing of each data DATA, transmitted through the high-speed data communication, with the timing of each four-phase clock OUT1-4 generated by the DLL, so as to control the DLL in such a manner that the timing of the four-phase clock is coincident with the center of the change timing of the data DATA. Then, a data regeneration circuit 3 latches the data DATA which is input in synchronization with the four-phase clocks OUT1-4 of which timing is adjusted. Then, a serial-to-parallel conversion circuit 4 performs serial-to-parallel conversion to output to the internal circuit.

Figure 3:
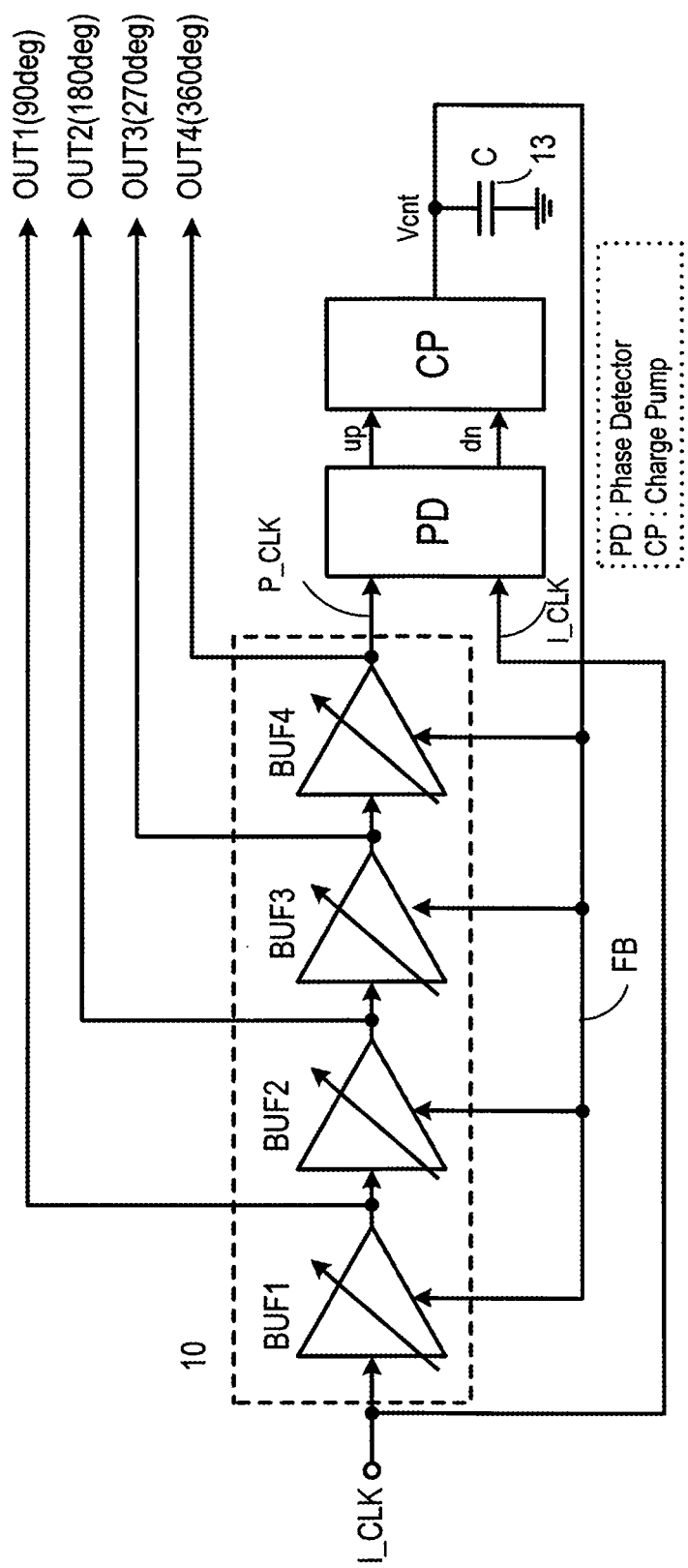
FIG. 3 is a configuration diagram of a delay locked loop circuit DLL.

FIG. 3 is a configuration diagram of a delay locked loop circuit DLL. The DLL depicted in FIG. 3 corresponds to a prior art of a DLL of the present embodiment. The DLL includes a delay circuit 10 which includes a plurality of serially connected delay buffers BUF1-4 and is configured to propagate an input clock I_CLK and output a delayed propagation clock P_CLK. Further, the DLL includes: a phase comparator PD which compares the phases of the propagation clock P_CLK and the input clock I_CLK; a charge pump CP which generates a charge current or a discharge current according to a phase difference detected by the phase comparator PD; and an integral capacitor 13. Then, the charge voltage Vcnt of the integral capacitor 13 is fed back, as a variable control voltage, to the delay buffers BUF1-4 in the delay circuit 10, to variably control each delay time of the delay buffers BUF1-4.

For example, when the propagation clock P_CLK advances in phase from the input clock I_CLK, the phase comparator PD generates a down signal (dn), and the charge pump CP generates a discharge current according to the down signal (dn), to reduce the charge voltage Vcnt of the integral capacitor 13. According to the reduced variable control voltage Vcnt, the operating speed of each delay buffer BUF1-4 is reduced, so that each delay time is elongated and the delay time of the delay circuit 10 is elongated. As a result, the phase of the propagation clock P_CLK is delayed.

Oppositely, when the propagation clock P_CLK is delayed in phase from the input clock I_CLK, the phase comparator PD generates an up signal (up), and the charge pump CP generates a charge current according to the up signal (up), to raise the charge voltage Vcnt of the integral capacitor 13. According to the raised variable control voltage Vcnt, the operating speed of each delay buffer BUF1-4 is raised, so that each delay time is shortened and the delay time of the delay circuit 10 is shortened. As a result, the phase of the propagation clock P_CLK advances.

As a result, the DLL makes the phase of the propagation clock P_CLK coincident with the phase of the input clock I_CLK which is a reference clock. When a state becomes a lock state in which the phases become coincident, the input clock I_CLK includes a phase difference of 360° from the propagation clock P_CLK. In the above state, the delay clocks OUT1-4 output from the four delay buffers BUF1-4 become multi-phase clocks of which phases are coincident with phases shifted by 90°, 180°, 270° and 360° from the input clock I_CLK, respectively.

Figure 4:
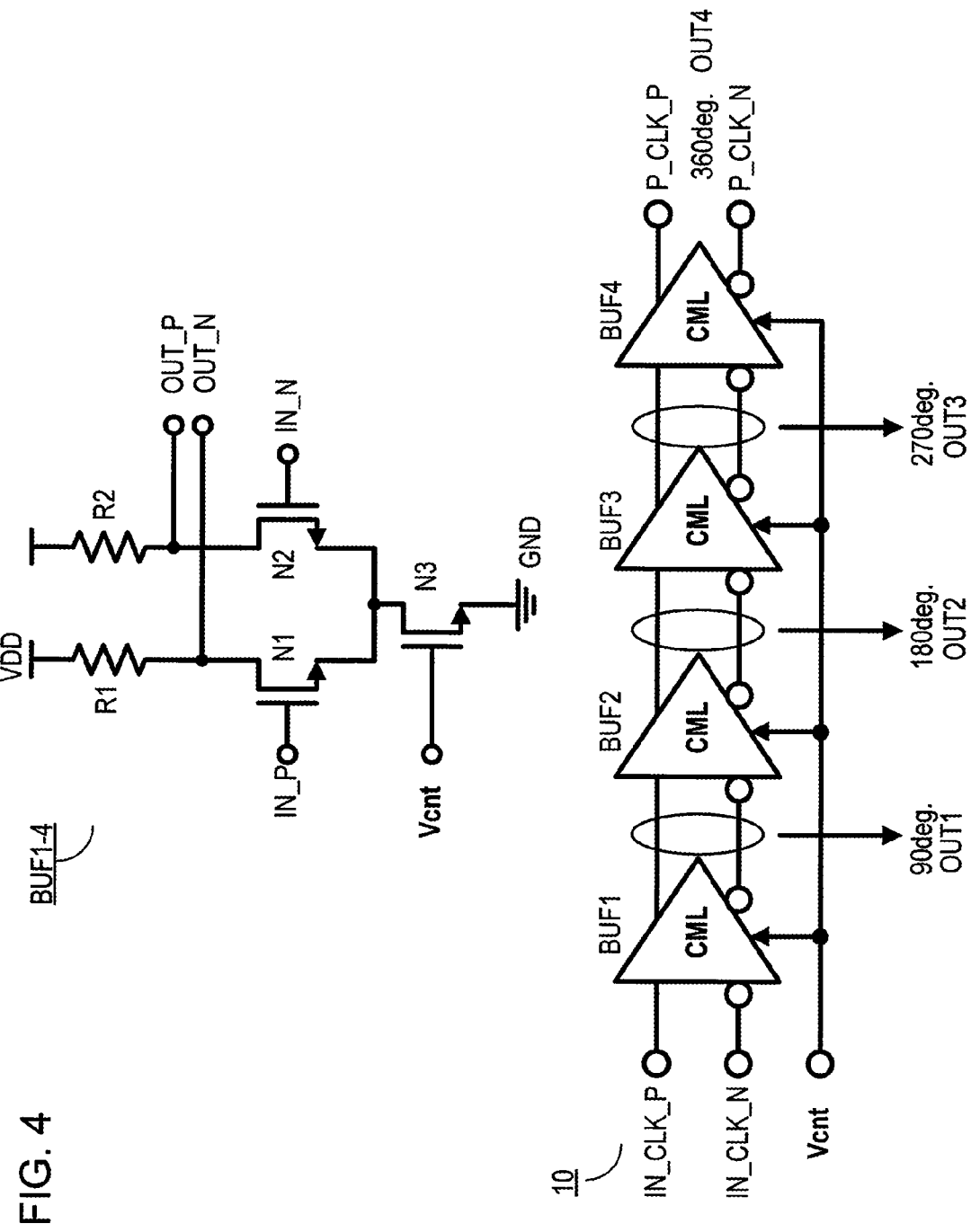
FIG. 4 is a diagram illustrating configuration examples of each delay buffer and a delay circuit constituted by serially connected delay buffers.

FIG. 4 is a diagram illustrating configuration examples of each delay buffer and a delay circuit constituted by serially connected delay buffers. Each delay buffer BUF1-4 depicted in FIG. 4 is a current mode logic (CML) circuit, as one example. Namely, the delay buffer includes: a pair of NMOS transistors N1, N2 to the gates of which differential clocks IN_P, IN_N are supplied, respectively, and the sources of which are commonly connected to each other; an NMOS transistor N3 which is disposed between the sources of the pair of transistors N1, N2 and ground power GND and to the gate of which the variable control voltage Vcnt is supplied; and loads R1, R2 respectively disposed between the drains of the pair of transistors N1, N2 and power VDD. Further, a negative-side output clock OUT_N is output from the drain of the transistor Ni, and a positive-side output clock OUT_P is output from the drain of the transistor N2, respectively.

In the delay buffers BUF1-4, when the variable control voltage Vcnt becomes higher in a region higher than the threshold voltage Vth of the transistor N3, a current amount of the transistor N3 is increased, so that the operating speed becomes higher and the delay time becomes shorter. Oppositely, in the delay buffers BUF1-4, when the variable control voltage Vcnt becomes lower in a region higher than the threshold voltage Vth of the transistor N3, a current amount of the transistor N3 is decreased, so that the operating speed becomes lower and the delay time becomes longer.

The delay circuit 10 depicted in FIG. 4 includes four delay buffers BUF1-4 connected in series. Differential input clocks IN_CLK_P, IN_CLK_N are propagated through the four delay buffers BUF1-4, so that differential propagation clocks P_CLK_P, P_CLK_N are output. Then, as depicted in FIG. 3, when the delay circuit 10 is used in the delay circuit of the DLL, a phase difference between the input clock and the propagation clock becomes one period)(360° of the input clock, and the phases of delay clocks OUT1-4 output from the four delay buffers BUF1-4 are coincident with phases shifted by 90°, 180°, 270° and 360° from the input clock, respectively.

Because the CML circuit is operated by a differential signal and driven by a constant current, it is possible to reduce a power supply noise, as compared to a CMOS circuit, and reduce a jitter caused by the power supply noise. Therefore, the DLL using a delay buffer by means of CML attracts attention because of exhibiting an improved jitter characteristic.

As one example, assuming a maximum frequency of the delay buffer by means of CML is fmax, a delay controllable range is, for example, from (⅔)fmax to fmax, according to a general design limit of the delay buffer. In contrast, there is a demand for the DLL of being compatible with from, for example, several Gbps in a legacy low-speed transmission system to, for example, several tens of Gbps in a most up-to-date high-speed transmission system. However, in order to cope with the above demand, it is difficult to be compatible with several tens of times of frequency ranges only by variably controlling the delay time of the delay buffer, using the variable control voltage Vcnt as depicted in FIGS. 3 and 4.

Figure 5:
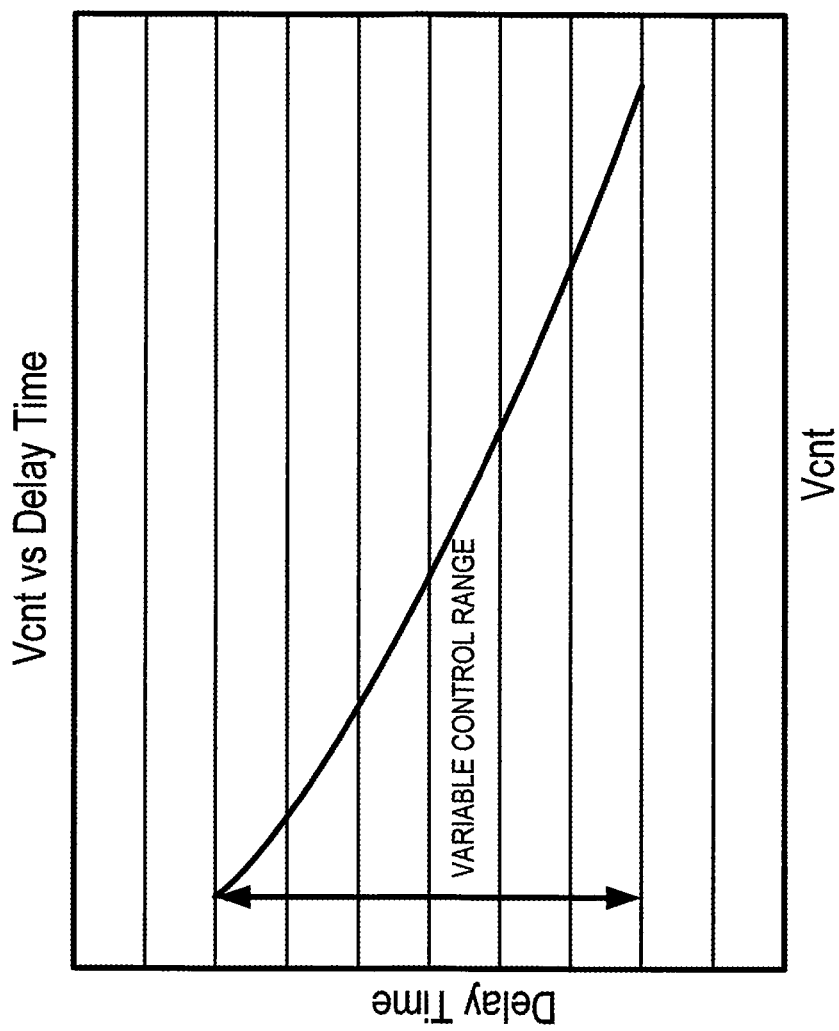
FIG. 5 is a diagram illustrating a control range of delay time relative to the variable control voltage Vcnt in the delay circuit of FIG. 4.

FIG. 5 is a diagram illustrating a control range of delay time relative to the variable control voltage Vcnt in the delay circuit of FIG. 4. As described earlier, if the variable control voltage Vcnt is raised, the speed of the delay buffer is increased and the delay time is shortened, whereas if the variable control voltage Vcnt is reduced, the speed of the delay buffer is reduced and the delay time is elongated. Further, as described above, the control range of delay time ranges from (⅔)fmax to fmax, for example, that is, the range of the delay time is 1 to 1.5 times.

Figure 6:
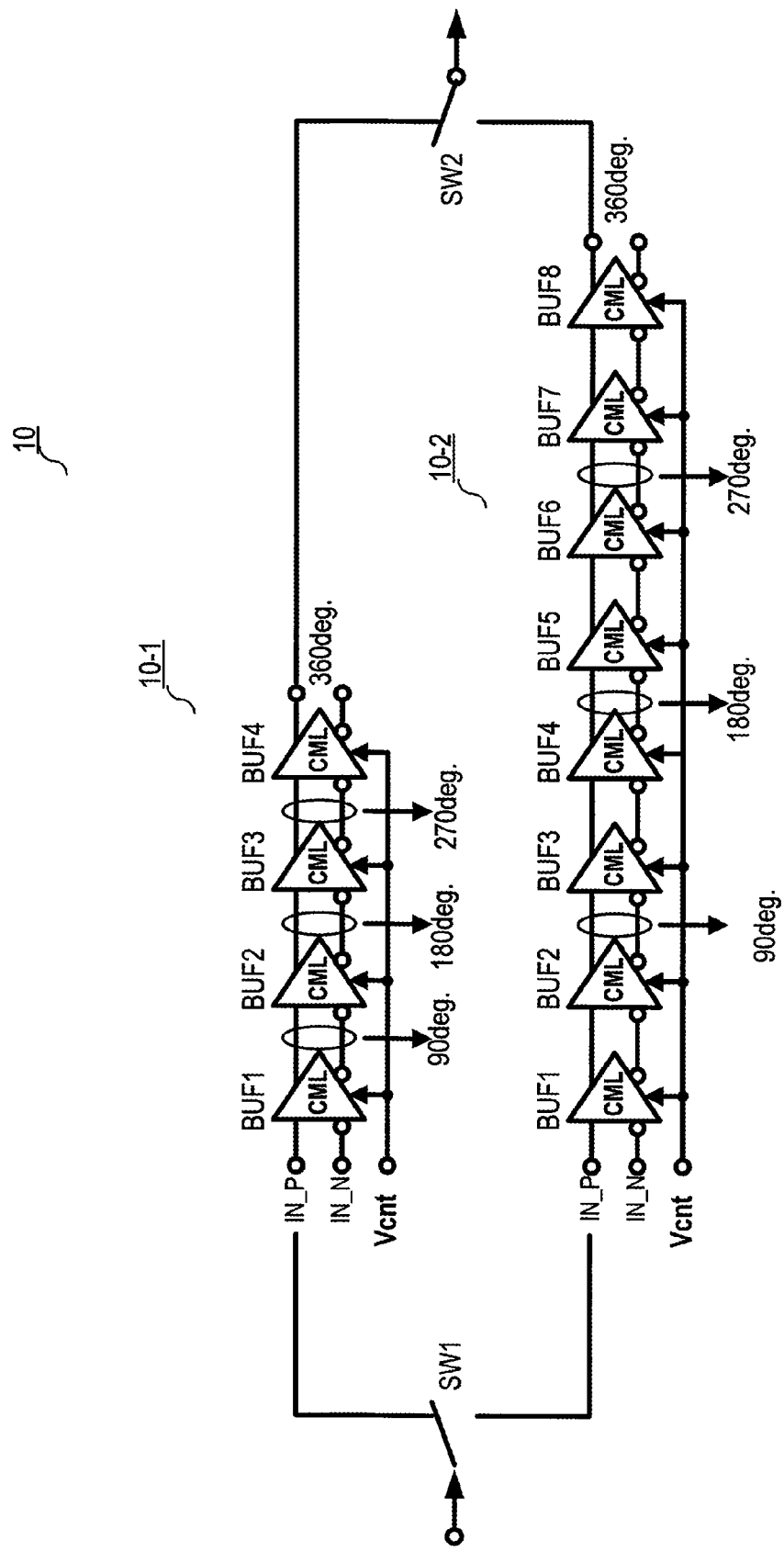
FIG. 6 is a diagram illustrating one example of a delay circuit operated by the switchover of a plurality of delay circuits in order to expand the control range of delay time.

FIG. 6 is a diagram illustrating one example of a delay circuit operated by the switchover of a plurality of delay circuits in order to expand the control range of delay time. The delay circuit 10 depicted in FIG. 6 includes: a first delay circuit 10-1 composed of a four-stage connection of delay buffers using CML; a second delay circuit 10-2 composed of an eight-stage connection of delay buffers using CML; and switches SW1, SW2. The first delay circuit 10-1 is identical to FIG. 4, whereas the second delay circuit 10-2 is composed of serially connected eight-stage delay buffers BUF1-8 using CML. Similar to the first delay circuit 10-1, the delay time of the delay buffer in each stage is controlled by the variable control voltage Vcnt. Further, when the switches SW1, SW2 are connected to the upper side, the first delay circuit 10-1 is operated as delay circuit, so that the control range becomes four times as large as the control range of the individual delay buffer. Oppositely, when the switches SW1, SW2 are connected to the lower side, the second delay circuit 10-2 is operated as delay circuit, so that the control range becomes eight times as large as the control range of the individual delay buffer.

Figure 7:
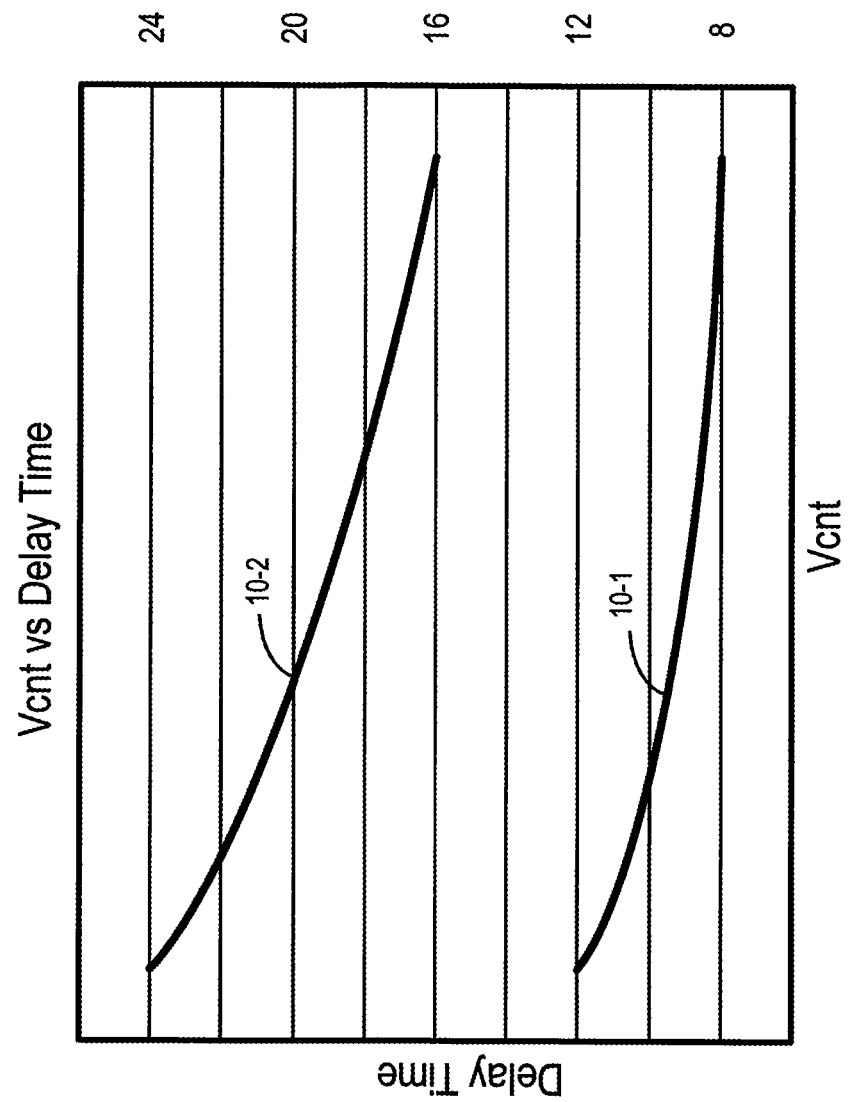
FIG. 7 is a diagram illustrating a control range of delay time in the delay circuit of FIG. 6.

FIG. 7 is a diagram illustrating a control range of delay time in the delay circuit of FIG. 6. The delay time is depicted on the vertical axis, relative to the variable control voltage Vcnt depicted on the horizontal axis. Now, assuming that the control range of each delay buffer is 2.0-3.0, the delay control range of the first delay circuit 10-1 constituted by four-stage delay buffers comes to 8.0-12.0, and the delay control range of the second delay circuit 10-2 constituted by eight-stage delay buffers comes to 16.0-24.0. Therefore, it is not possible to control the delay range to 12.0-16.0 if the first and second delay circuits 10-1, 10-2 are switched over. Further, as compared to a delay control characteristic when the first delay circuit 10-1 is used, a delay control characteristic when the second delay circuit 10-2 is used produces a larger delay amount change relative to the change of the variable control voltage Vcnt. This brings about a problem of producing a different jitter characteristic in the DLL. Further, among others, there is a problem that a circuit scale becomes large due to the provision of two types of delay circuits 10-1, 10-2.

[Delay Circuit and DLL including the Delay Circuit according to the Present Embodiment]

Figure 8:
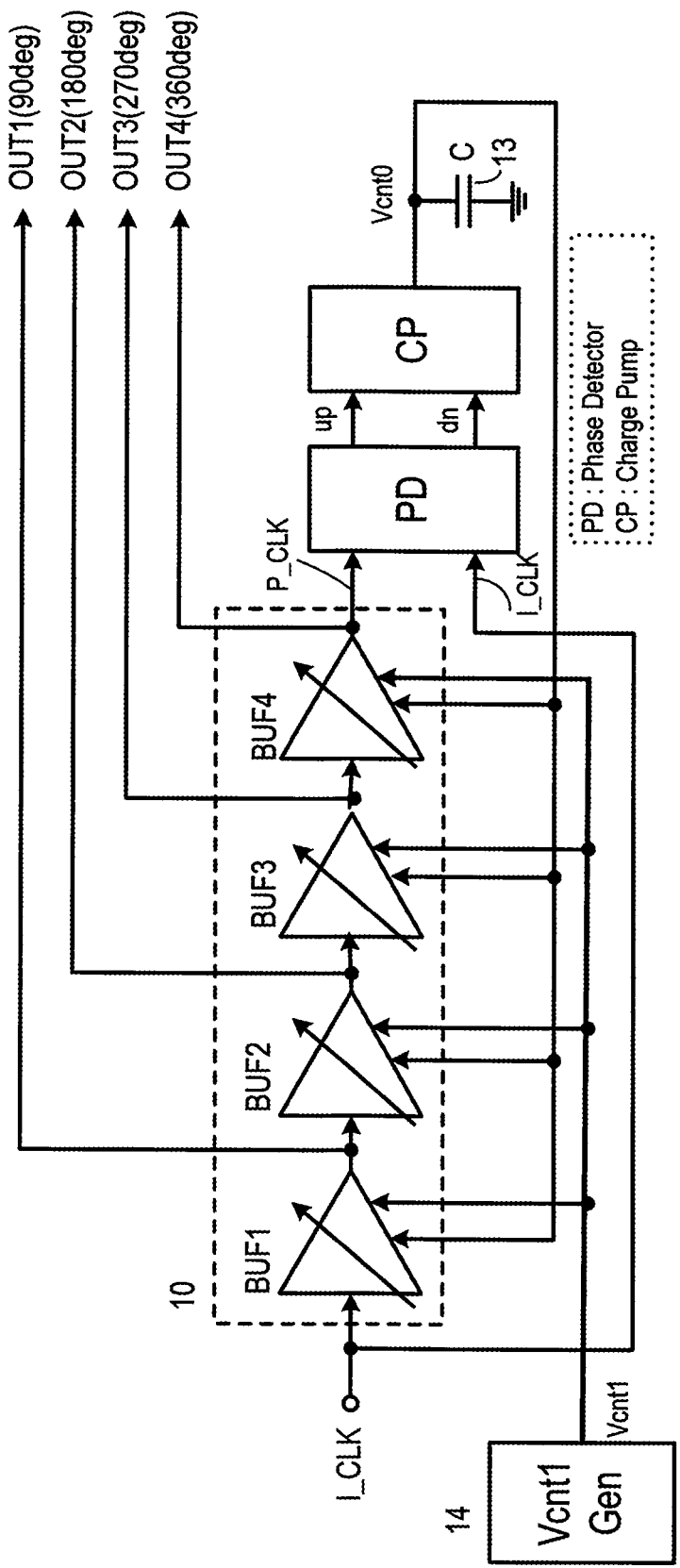
FIG. 8 is a diagram illustrating a delay locked loop circuit (DLL) including a delay circuit according to the present embodiment.

FIG. 8 is a diagram illustrating a delay locked loop circuit (DLL) including a delay circuit according to the present embodiment. The DLL depicted in FIG. 8 includes: a delay circuit 10 which includes four serially connected delay buffers BUF1-4 and is configured to propagate an input clock I_CLK and output a propagation clock P_CLK; a phase comparator PD which compares the phases of the propagation clock P_CLK and the input clock I_CLK; a charge pump CP which generates a charge current or a discharge current according to a phase difference, output from the phase comparator PD, between the propagation clock P_CLK and the input clock I_CLK; and an integral capacitor 13 which is charged by the charge current and discharged by the discharge current. Further, each delay buffer BUF1-4 includes, though not illustrated, at least two delay units each capable of variably controlling each delay amount.

Further, a voltage Vcnt0 of the integral capacitor 13 is supplied to a first delay unit in each delay buffer BUF1-4 as a variable control voltage, so as to variably control the delay time of the delay circuit 10 to control the propagation clock P_CLK to be coincident in phase with the input clock I_CLK. Further, a fixed control voltage Vcnt1 generated by a fixed control voltage generator circuit 14 is supplied to a second delay unit in each delay buffer BUF1-4, so as to control the control range of the delay amount of the delay circuit 10 to a control range corresponding to the fixed control voltage.

As such, the DLL depicted in FIG. 8 is different from the DLL depicted in FIG. 3 in a point that the DLL of FIG. 8 includes at least two delay units delay amount of which is capable of being variably controlled, and the delay time of the first delay unit among the above delay units is controlled by the variable control voltage Vcnt0, and the delay time of the second delay unit is changed by the fixed control voltage Vcnt1.

FIGS. 9A, 9B are diagrams illustrating a delay circuit according to the present embodiment. FIG. 9B illustrates a delay circuit 10. The delay circuit 10 depicted in FIG. 9B includes four serially connected delay buffers BUF1-4 and is configured to propagate differential input clocks IN_CLK_P, IN_CLK_N through the four delay buffers BUF1-4, so as to output differential propagation clocks P_CLK_P, P_CLK_N.

FIG. 9A illustrates a circuit of each delay buffer BUF1-4. Each delay buffer BUF1-4 includes a first delay unit CML1 and a second delay unit CML2 connected in series. The first and second delay units CML1, CML2 are CML circuits. The first delay unit CML1 includes: a pair of NMOS transistors N1, N2 to the gates of which differential clocks IN_P, IN_N are supplied, respectively, and the sources of which are commonly connected to each other; an NMOS transistor N3 which is disposed between the sources of the pair of transistors N1, N2 and the ground power GND and to the gate of which the variable control voltage Vcnt0 is supplied; and loads R1, R2 respectively disposed between the drains of the pair of transistors N1, N2 and the power VDD. The above configuration is the same as in FIG. 4.

Similar to the first delay unit CML1, the second delay unit CML2 includes: a pair of NMOS transistors N11, N12 to the gates of which the drain of the transistor N2 and the drain of the transistor N1 are supplied, respectively, and the sources of which are commonly connected to each other; an NMOS transistor N13 which is disposed between the sources of the pair of transistors N11, N12 and the ground power GND and to the gate of which the fixed control voltage Vcnt1 is supplied; and loads R11, R12 disposed between the drains of the pair of transistors N11, N12 and the power VDD, respectively.

Then, in the four delay buffers BUF1-4 constituting the delay circuit 10, connections are made in such a manner that the positive and negative output clocks OUT_P, OUT_N of a delay buffer in a precedent stage are supplied to a delay buffer in the subsequent stage, as positive and negative input clocks IN_P, IN_N. Similarly, connections are made such that, in each delay buffer BUF1-4, the positive and negative output clocks of the first delay unit CML1 are supplied as positive and negative input clocks of the second delay unit CML2.

Figure 10A:
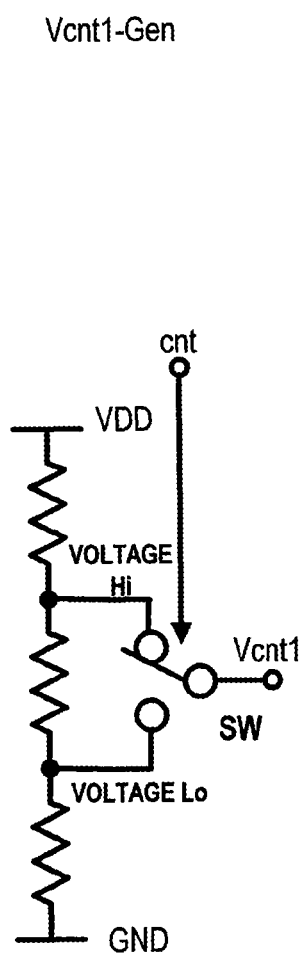
FIGS. 10A, 10B are diagrams illustrating a fixed control voltage generator circuit according to the present embodiment.
Figure 10B:
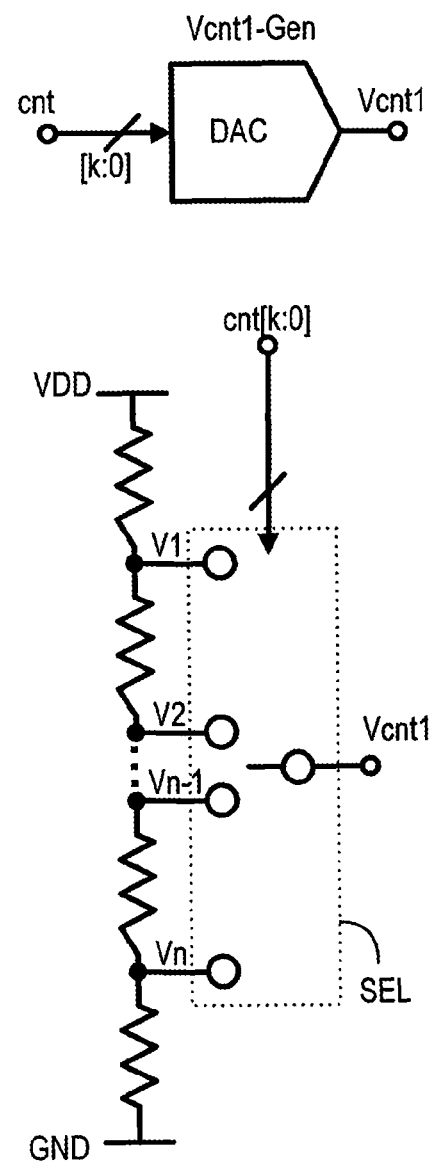

FIGS. 10A, 10B are diagrams illustrating a fixed control voltage generator circuit according to the present embodiment. The fixed control voltage generator circuit Vcnt1-Gen depicted in FIG. 10A selects a fixed control voltage Vcnt1 to be either a high voltage Hi or a low voltage Lo by means of the switch SW according to a one-bit control code (cnt). Accordingly, the fixed control voltage Vcnt1, when selected to be the high voltage Hi, produces a shorter control range of delay time in the delay circuit. Also, when selected to be the low voltage Lo, the fixed control voltage Vcnt1 produces a longer control range of delay time in the delay circuit.

Figure 11:
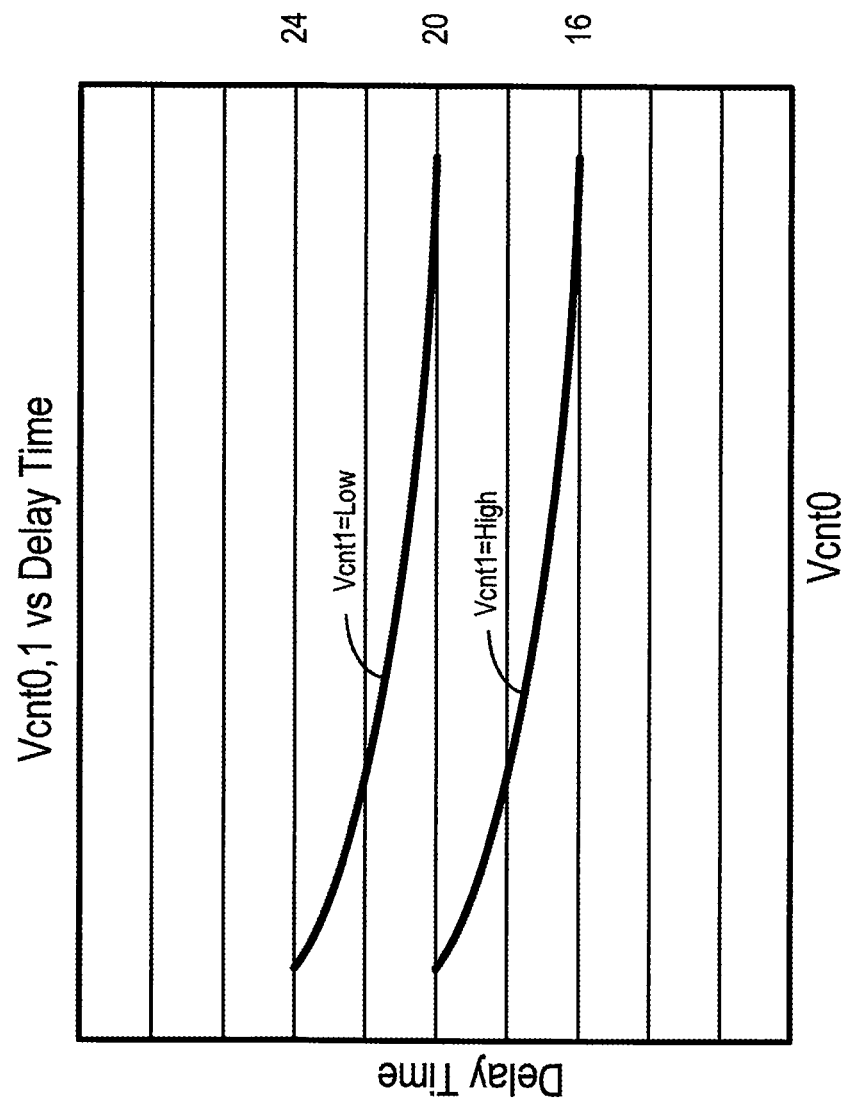
FIG. 11 is a diagram illustrating each control range of a delay amount of the delay circuit, when the fixed control voltage Vcnt1 is either the high voltage or the low voltage.

FIG. 11 is a diagram illustrating each control range of a delay amount of the delay circuit, when the fixed control voltage Vcnt1 is either the high voltage or the low voltage. For example, in the delay circuit depicted in FIG. 9B, assuming each control range of the first and second delay units CML1, CML2 be 2.0 to 3.0, a delay time when the fixed control voltage Vcnt1 is the high voltage be 2.0, and a delay time when the fixed control voltage Vcnt1 is the low voltage be 3.0. Then, when the fixed control voltage Vcnt1 is the high voltage (High), the overall control range of the delay amount is $\{(2.0 \text{ to } 3.0)+2.0\}\times 4=16$ to 20, whereas when the fixed control voltage Vcnt1 is the low voltage (Low), the overall control range is $\{(2.0 \text{ to } 3.0)+3.0\}\times 4=20$ to 24.

The fixed control voltage generator circuit Vcnt1-Gen depicted in FIG. 10B is a DAC (digital-to-analog converter) which outputs three or more kinds of voltage Vcnt0 according to a control code (cnt) composed of a plurality of bits. Namely, the fixed control voltage generator circuit includes: a resistor ladder circuit disposed between the power VDD and GND; and a selector SEL which selects one node among a multiplicity of connection nodes of the resistor ladder, according to the control code (cnt).

Figure 12:
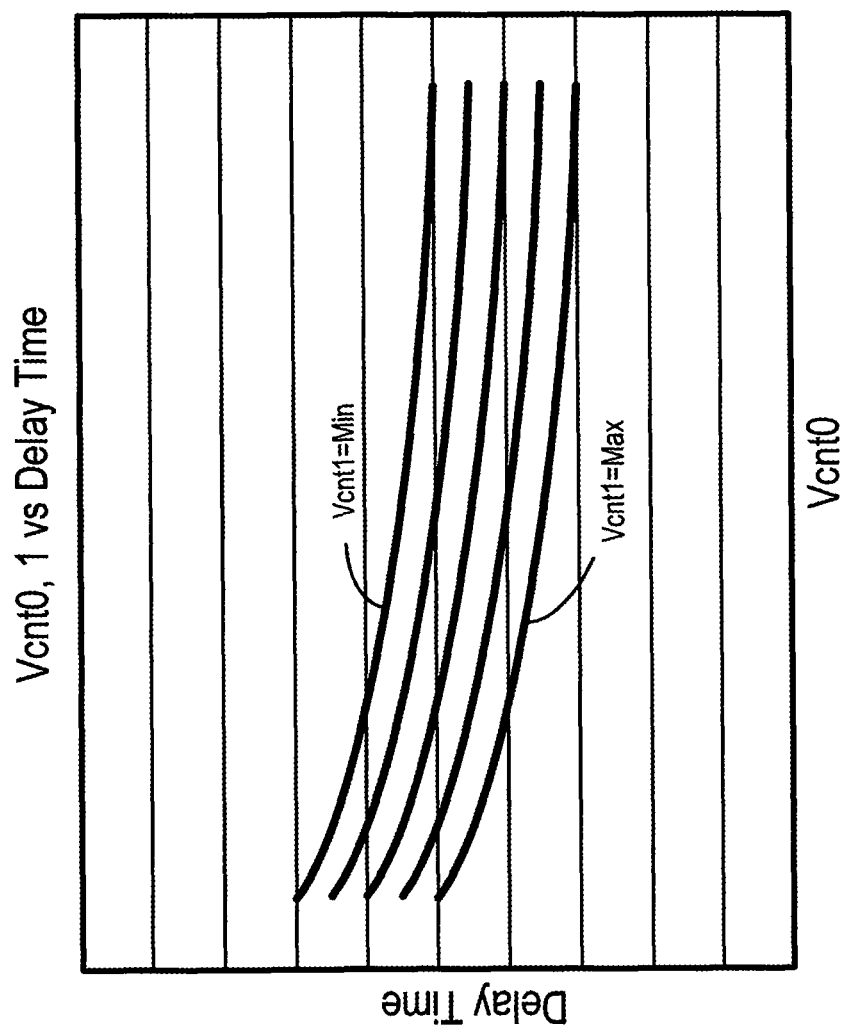
FIG. 12 is a diagram illustrating each control range of delay time in the delay circuit when the fixed control voltage Vcnt1 is one of five kinds of voltages.

FIG. 12 is a diagram illustrating each control range of delay time in the delay circuit when the fixed control voltage Vcnt1 is one of five kinds of voltages. In the example depicted in FIG. 12, there are three kinds of control ranges between the cases of a maximum value (Max) and a minimum value (Min) of the fixed control voltage Vcnt1. Therefore, the delay circuit is controlled at a plurality of control ranges with higher resolution than in the case of FIG. 11.

Figure 13:
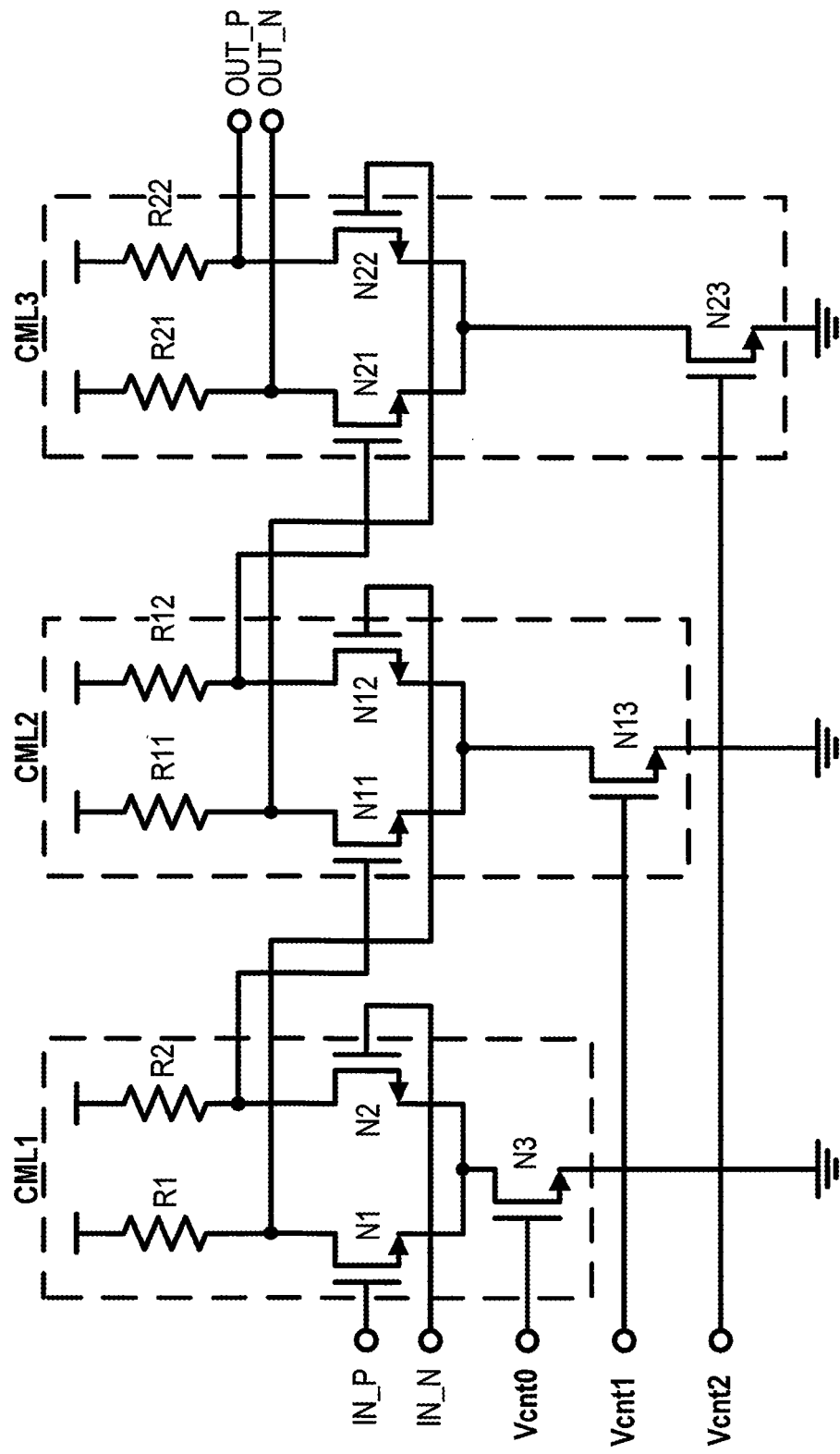
FIG. 13 is a diagram illustrating a deformation example of a delay buffer of the delay circuit according to the present embodiment.

FIG. 13 is a diagram illustrating a modified example of a delay buffer of the delay circuit according to the present embodiment. In the modified example of FIG. 13, each delay buffer BUF1-4 includes: a first delay unit CML1 which is delay controlled by the variable control voltage Vcnt0; a second delay unit CML2 which is delay controlled by a first fixed control voltage Vcnt1; and a third delay unit CML3 which is delay controlled by a second fixed control voltage Vcnt2. Each delay unit is a CML circuit.

Here, it is desirable that each delay characteristic of the second and third delay units is designed in such a manner that, for example, the third delay unit is higher in speed than the second delay unit. For example, desirably, each transistor size (channel width) of transistors N21, N22, N23 in the third delay unit CML3 is formed to be larger than the corresponding transistor size in the second delay unit CML2, or alternatively, each resistance value of the loads R21, R22 in the third delay unit CML3 is formed to be smaller than the corresponding resistance value in the second delay unit CML2. As a result, the third delay unit CML3 operates at a higher speed, so that the delay time thereof becomes shorter.

Figure 14:
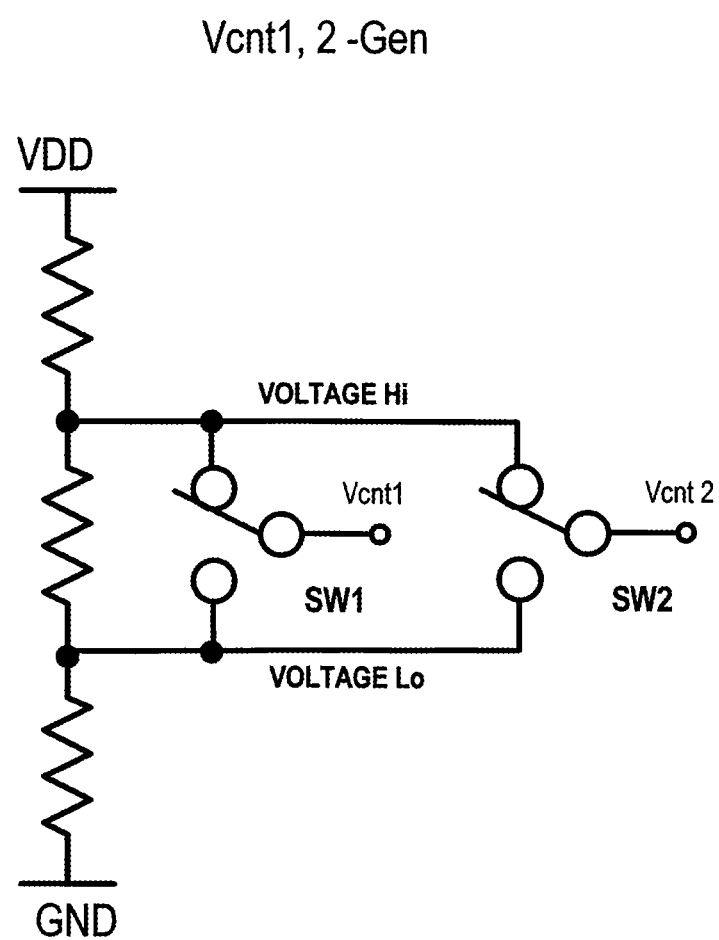
FIG. 14 is a diagram illustrating a fixed control voltage generator circuit of the delay circuit depicted in FIG. 13

FIG. 14 is a diagram illustrating a fixed control voltage generator circuit of the delay circuit depicted in FIG. 13. The fixed control voltage generator circuit depicted in FIG. 14 is of a simple configuration including a resistor ladder composed of three resistors and two sets of switches SW1, SW2. By means of the switch SW1, the first fixed control voltage Vcnt1 is selected to be either a high voltage Hi or a low voltage Lo, and by means of the switch SW2, the second fixed control voltage Vcnt2 is also selected to be either the high voltage Hi or the low voltage Lo.

The delay time of the second delay unit CML2 is longer than the delay time of the third delay unit CML3 even under the same high voltage Hi or the same low voltage Lo. With the above weighting of the delay times, the delay circuit can be controlled to be in the four kinds of variable delay ranges if the two fixed control voltages Vcnt1, Vcnt2 are individually controlled to be either the high voltage Hi or the low voltage Lo.

Figure 15:
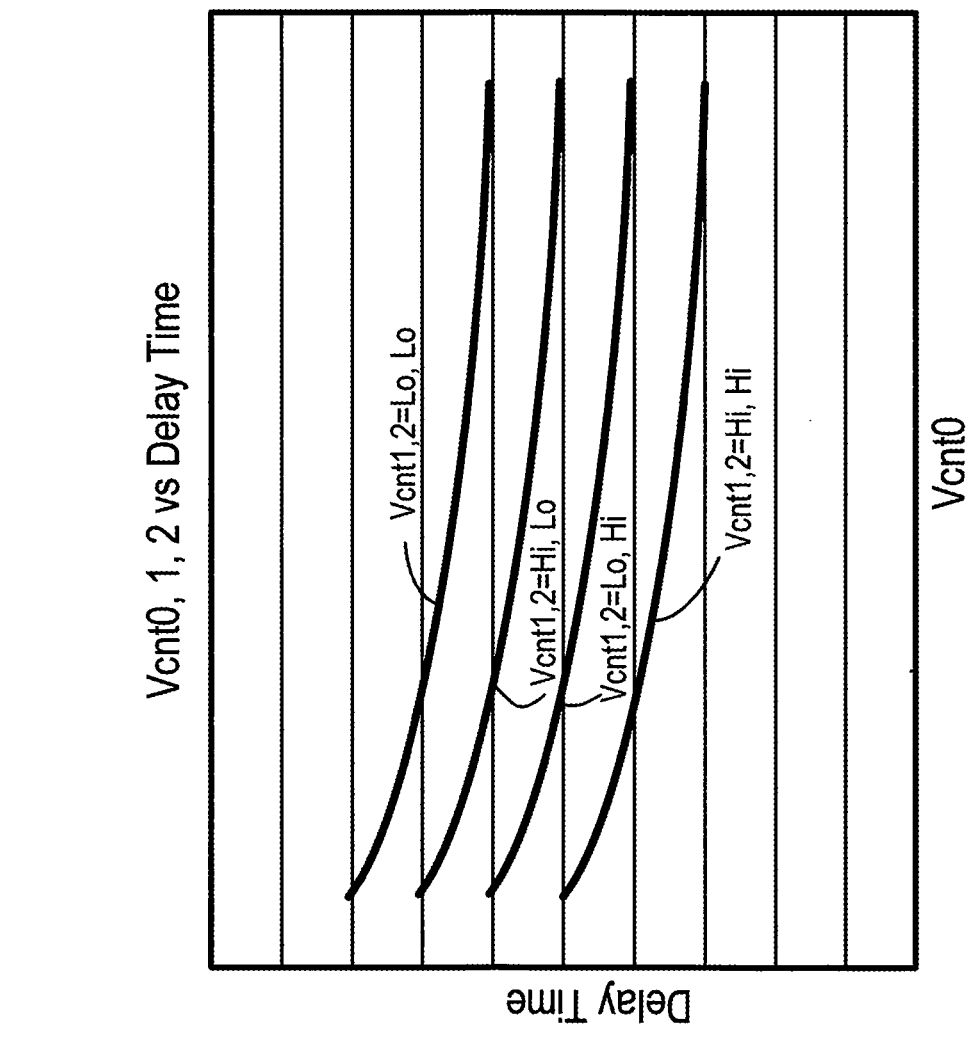
FIG. 15 is a diagram illustrating each control range of delay time in the delay circuit of FIGS. 13, 14.

FIG. 15 is a diagram illustrating each control range of delay time in the delay circuit of FIGS. 13, 14. When the first and second fixed control voltages Vcnt1, Vcnt2 are controlled to be Hi and Hi, respectively, a variable delay range of a minimum delay time is obtained, whereas when controlled to be Lo and Lo, a control range of a maximum delay time is obtained. Further, when the first and second fixed control voltages Vcnt1, Vcnt2 are controlled to be Hi and Lo, respectively, the second shortest control range is obtained, whereas when controlled to be Lo and Hi, the third shortest control range is obtained. Thus, the delay circuit can provide four kinds of control ranges by use of the two fixed control voltages Vcnt1, Vcnt2 each controlled to be either Hi or Lo. If the characteristics of the first and second delay units are equivalent, control to three kinds of control ranges can only be made using the two fixed control voltages.

It is necessary to set a fixed control voltage to be output from the fixed control voltage generator circuit, at power activation and at restoration from a sleep mode. As depicted in FIG. 1, at the power activation etc. as an example, the CPU core 1 sets a control code (cnt) to a register REG1. As a result, a DLL individual control voltage generator circuit generates an individual control voltage corresponding to the control code (cnt) set to the register REG1.

[DLL according to Second Embodiment]

Figure 16:
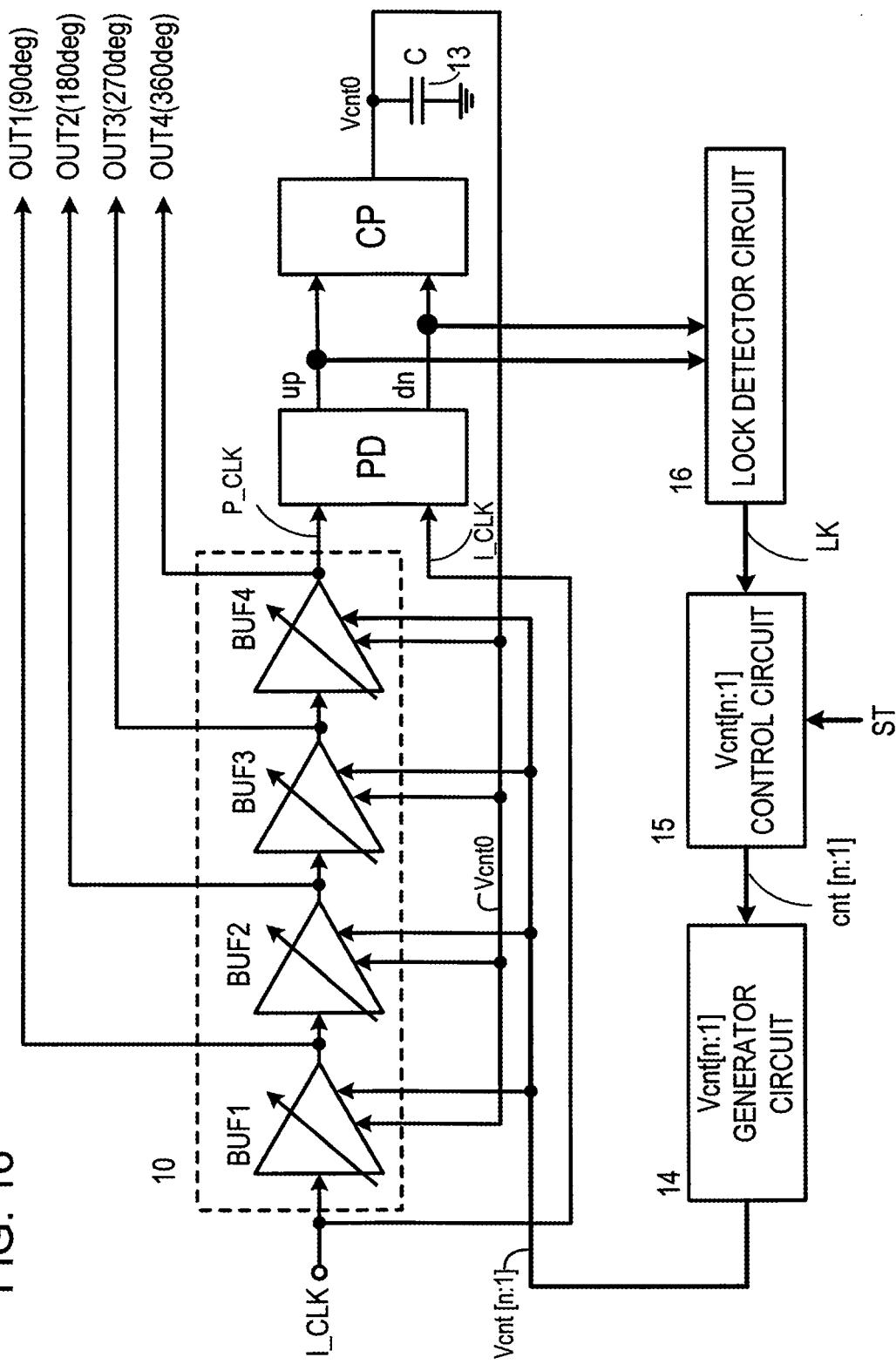
FIG. 16 is a diagram illustrating a DLL according to a second embodiment.

FIG. 16 is a diagram illustrating a DLL according to a second embodiment. As will be described later, the DLL of the second embodiment sets, at the power activation etc., a fixed control voltage by spontaneous operation so as to be within a control range of an optimal delay amount according to an input clock speed to be compatible with.

The DLL of FIG. 16 includes a delay circuit 10, a phase comparator PD, a charge pump CP and an integral capacitor 13, similar to FIG. 8. Each of four delay buffers BUF1-4 includes a plurality of delay units each constituted by CML. A voltage Vcnt0 of the integral capacitor 13 is input to a first delay unit CML1 in each delay buffer BUF1-4. A fixed control voltage Vcnt[n:1] generated by a fixed control voltage generator circuit 14 is input to other delay units than a first delay unit in each delay buffer BUF1-4. Incidentally, when the delay buffer includes, as depicted in FIG. 9A, only one second delay unit CML2 other than the first delay unit CML1, the fixed control voltage is only one Vcnt1. In the above case, the fixed control voltage generator circuit 14 generates each fixed control voltage Vcnt1 among four or more voltages according to the control code (cnt), as depicted in FIG. 10B.

The DLL of FIG. 16 is different from the DLL of FIG. 8 in a point of including a fixed control voltage control circuit 15 and a lock detector circuit 16. The fixed control voltage control circuit 15, in response to an activation signal ST generated at the power activation, the restoration from the sleep state or the like, successively changes the control code (cnt) either from a maximum value toward a minimum value or from a minimum value toward a maximum value. The fixed control voltage control circuit 15 thereby causes the fixed control voltage generator circuit 14 to successively generate each fixed control voltage Vcnt[n:1] either from a maximum value toward a minimum value or from a minimum value toward a maximum value, and, by using a lock detection signal LK, monitors whether or not the lock detector circuit 16 detects a lock state at each fixed control voltage Vcnt[n:1].

The lock detector circuit 16 detects the occurrence or non-occurrence of the lock state, in which the phases of the propagation clock P_CLK and the input clock I_CLK become coincident, on the basis of an up signal (up) and a down signal (dn) indicative of the phase comparison result of the phase comparator PD, so as to output the lock detection signal LK. Ideally, a state that neither the up signal (up) nor the down signal (dn) is generated is the lock state. However, when a jitter is tolerated to a certain degree, it is determined to be a lock state if each pulse width of the up signal (up) and the down signal (dn) comes to a reference value or smaller.

Then, the fixed control voltage control circuit 15 sets, as an optimal control code, a control code (cnt) corresponding to an intermediate value between the minimum fixed control voltage and the maximum fixed control voltage in which the lock state is detected. By this, the fixed control voltage generator circuit 14 outputs to the delay buffers BUF1-4 an optimal fixed control voltage Vcnt[n:1] corresponding to the set control code (cnt).

Figure 17:
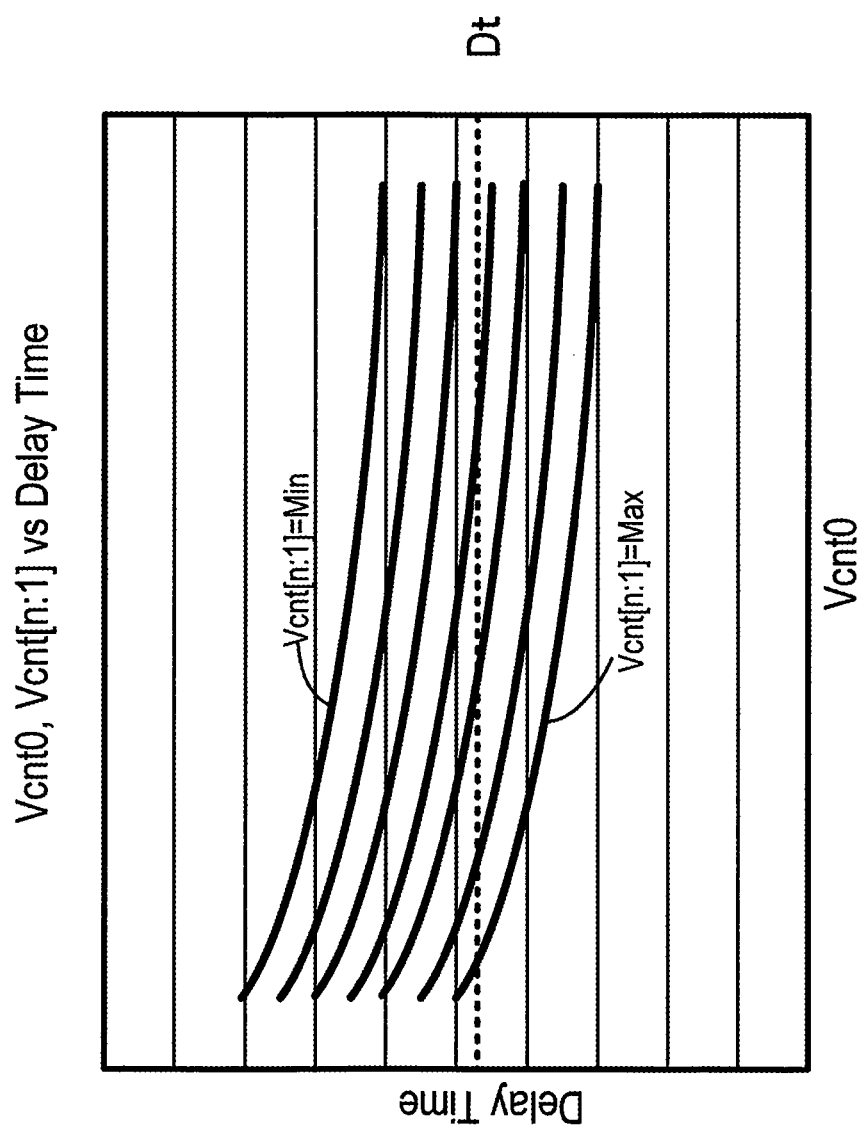
FIG. 17 is a diagram illustrating the setting of a DLL fixed control voltage according to the second embodiment.

FIG. 17 is a diagram illustrating the setting of a DLL fixed control voltage according to the second embodiment. Now, Dt is defined to be the time of one clock period in the environment in which DLL is operated. In that case, it is necessary for the DLL to be synchronized in phase with the delay time Dt in FIG. 17.

Then, as described above, the fixed control voltage control circuit 15 monitors the lock detection signal LK at each fixed control voltage, while successively changing the fixed control voltage Vcnt[n:1] from the maximum value toward the minimum value, or in the reverse direction thereto. As a result, as depicted in FIG. 17, lock detection is made at four voltages including the maximum value of the fixed control voltage Vcnt[n:1] and subsequent three voltages from the maximum value. Then, the fixed control voltage control circuit 15 sets a voltage nearest to the center voltage among the lock-detected four voltages (either one of two voltages in the middle of the four voltages) to be a fixed control voltage. More specifically, the fixed control voltage control circuit 15 stores, in a register, a control code (cnt) corresponding to the fixed control voltage corresponding to a central control range, to enable setting the fixed control voltage.

As such, the control range of a delay amount by the variable control voltage Vcnt0 under the above set fixed control voltage becomes a control range in which a lock-in voltage of the variable control voltage Vcnt0 is located substantially at the center thereof. Thus, it is possible to perform more appropriate control of the delay amount. Further, it is possible to cope with both a minute variation (jitter) of the input clock I_CLK of the DLL and a variation of the variable control voltage Vcnt0 of the DLL.

[Delay Circuit including Delay Buffer by Means of CMOS Inverter]

Figure 18:
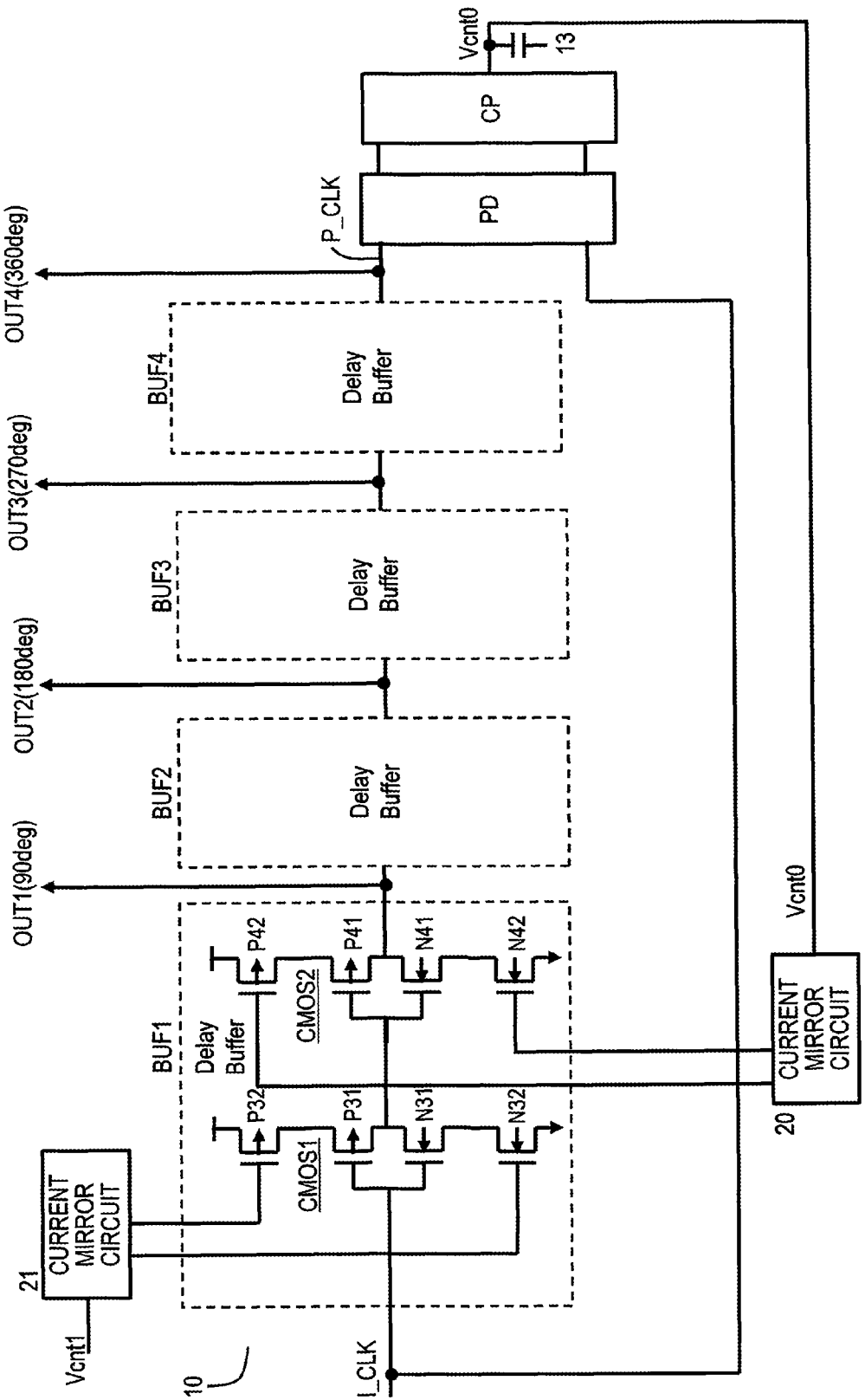
FIG. 18 is a diagram illustrating a DLL provided with a delay circuit including a delay buffer constituted by a CMOS inverter.

FIG. 18 is a diagram illustrating a DLL provided with a delay circuit including a delay buffer constituted by a CMOS inverter. The DLL delay buffer described earlier is constituted by two or more CML circuits. In contrast, delay buffers BUF1-4 of the DLL delay circuit depicted in FIG. 18 is so configured that two CMOS inverters are connected in series.

In FIG. 18, two CMOS inverters CMOS1, CMOS2 constituting a delay buffer BUF1 are depicted. More specifically, the delay buffer BUF1 includes: a first CMOS inverter (delay unit) CMOS1 which includes NMOS transistors N31, N32 and PMOS transistors P31, P32; and a second CMOS inverter (delay unit) CMOS2 which includes NMOS transistors N41, N42 and PMOS transistors P41, P42.

In the above CMOS inverters CMOS1, CMOS2, the input clock I_CLK is input to the gates of the transistors N31, P31 in COMOS1 and the transistors N41, P41 in CMOS2 and propagated. To the gates of the transistors N32, P32 and the gates of the transistors N42, P42, a voltage generated by a current mirror circuit 21 according to the fixed control voltage Vcnt1 and a voltage generated by a current mirror circuit 20 according to the variable control voltage Vcnt0 are applied, respectively, so that the delay time of the CMOS inverters is controlled. Namely, in the first CMOS inverter CMOS1, a current amount is controlled by the fixed control voltage Vcnt1 through a current mirror circuit 21, and thereby a delay time is controlled. Similarly, in the second CMOS inverter CMOS2, a current amount is controlled by the variable control voltage Vcnt0 through a current mirror circuit 20, and thereby a delay time is controlled. Therefore, each current mirror circuit is a current control circuit which controls a current amount according to the control voltage Vcnt0, Vcnt1. Here, the relationship of the first and second CMOS inverters with the fixed and variable control voltages Vcnt1, Vcnt0 may be reversed.

Figure 19:
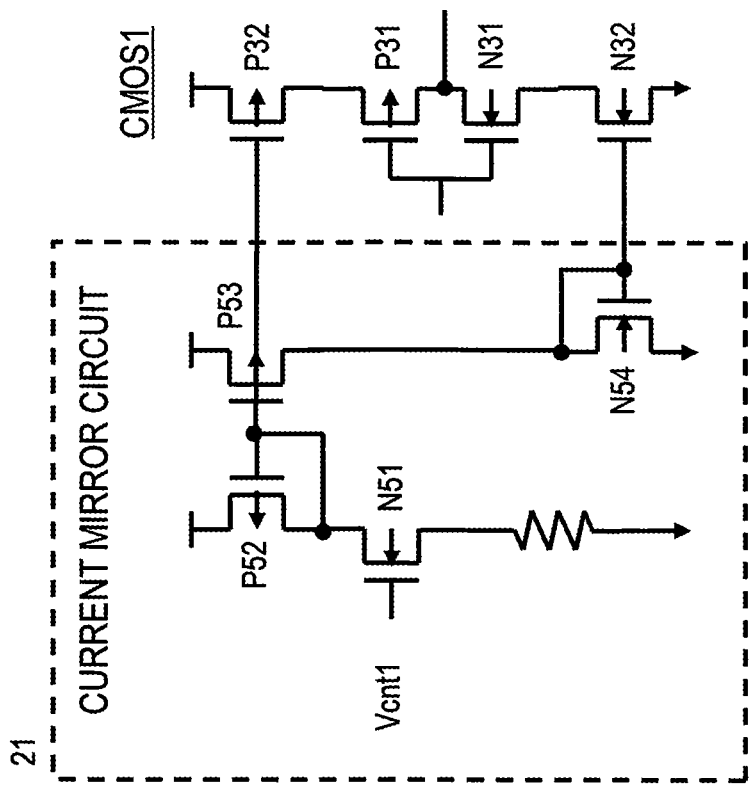
FIG. 19 is a diagram illustrating one example of a current mirror circuit, that is, a current control circuit.

FIG. 19 is a diagram illustrating one example of a current mirror circuit, that is, a current control circuit. As an example, there is depicted in FIG. 19 the current mirror circuit 21 which supplies the control voltage to the first CMOS inverter CMOS1. The current mirror circuit 21 includes: an NMOS transistor N51 to the gate of which the control voltage Vcnt1 is input; PMOS transistors P52, P53 the gates of which are commonly connected to each other; and an NMOS transistor N54 connected to the transistor P53. The gate voltage of the transistors P52, P53 is connected to the gate of the transistor P32 of the CMOS inverter, and the gate voltage of the transistor N54 is connected to the gate of the transistor N32 of the CMOS inverter.

The operation of the current mirror circuit 21 is as follows. When the control voltage Vcnt1 is decreased, the conduction resistance of the transistor N51 increases and the current decreases, and the drain voltage of the transistor N51 increases and the current amount of the transistor P52 also decreases. In the current mirror circuit, the transistors P52, P53, P32 having the same gate voltage cause each current flow proportional to each transistor size. For example, the transistors P52, P53, P32 having the same gate voltage make the same drain current flow if the transistor sizes are the same. Therefore, by the decrease of the current of the transistor P52, the current in the transistor P32 in the CMOS inverter also decreases. Further, the drain current of the transistor N54 in the current mirror circuit decreases as well, and the current of the transistor N32 of the CMOS inverter, the gate of which is commonly connected to the transistor N54, also decreases. The decreased current of the transistors P32, N32 elongates the delay time of the CMOS inverter.

Oppositely, when the control voltage Vcnt1 becomes high, opposite operation to the above description is made, so that each current in the transistors P32, N32 increases. The increased current of the transistors P32, N32 shortens the delay time of the CMOS inverter.

As described above, in the CMOS inverter CMOS1 and the current mirror circuit 21 depicted in FIG. 19, similar to the aforementioned delay unit constituted by the CML circuit, the delay time of the delay unit CMOS1 constituted by the CMOS inverter becomes shorter when the control voltage Vcnt1 increases, and the delay time becomes longer when the control voltage Vcnt1 decreases.

Accordingly, similar to the delay circuit 10 of the DLL circuit depicted in FIG. 8, the delay circuit 10 of the DLL circuit depicted in FIG. 18 changes the control range of the delay amount of the delay circuit 10 by the fixed control voltage Vcnt1, and variably controls the delay time of the delay circuit 10 by the variable control voltage Vcnt0 within the control range.

It may also be possible to configure the delay buffers BUF1-4 of the delay circuit 10 with three or more delay units CMOS connected in series, so that the first delay unit is delay controlled by the variable control voltage Vcnt0, and other delay units than the first delay unit are delay controlled by the plurality of fixed control voltages Vcnt[n: 1], respectively. As a result, it is possible to obtain configurations similar to FIGS. 13, 14 and 15.

As described above, by means of the fixed control voltage, the delay circuit and the DLL including the delay circuit according to the present embodiment changes the control range of the delay amount within which the delay amount is variably controlled by means of the variable control voltage, so as to be compatible with a wideband clock. Accordingly, when the DLL according to the embodiment is incorporated into a processor, it is possible to be compatible with a wideband reference clock of the processor.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A delay circuit comprising:
a plurality of delay buffers each including two or more serially connected delay units, each of the delay units being capable of variably controlling a delay amount;
a variable control voltage generator circuit configured to supply, to a first delay unit included in each of the plurality of delay buffers, a variable control voltage provided to control the delay amount of the first delay unit; and
a fixed control voltage generator circuit configured to supply, to a second delay unit included in each of the plurality of delay buffers, a fixed control voltage among a plurality of fixed control voltages for controlling the delay amount of the second delay unit,
wherein the plurality of delay buffers are connected in series, and an input signal propagates through the plurality of serially connected delay buffers.

2. The delay circuit according to claim 1,
wherein each delay unit includes a current mode logic circuit including a first transistor and a second transistor to the gates of which each input signal is supplied and the sources of which are commonly connected, and a third transistor which is disposed between the source of the first and second transistors and a power source and to the gate of which a control voltage is supplied, and
wherein the variable control voltage is supplied to the gate of the third transistor of the current mode logic circuit of the first delay unit, and the fixed control voltage is supplied to the gate of the third transistor of the current mode logic circuit of the second delay unit.

3. The delay circuit according to claim 1,
wherein each delay unit includes:
an inverter circuit including a first P-type transistor and a first N-type transistor to the gates of which an input signal is supplied and the drains of which are connected each other, a second P-type transistor disposed between the source of the first P-type transistor and a first power source, and a second N-type transistor disposed between the source of the first N-type transistor and a second power source;
a first current control circuit configured to supply a first and a second control voltage corresponding to the variable control voltage to the gates of the second P-type and N-type transistors of the inverter circuit of the first delay unit; and
a second current control circuit configured to supply a third and a fourth control voltage corresponding to the fixed control voltage to the gates of the second P-type and N-type transistors of the inverter circuit of the second delay unit.

4. The delay circuit according to claim 1,
wherein a variable delay range of the plurality of serially connected delay buffers by means of the variable control voltage is controlled to be a different variable delay range according to the plurality of fixed control voltages.

5. The delay circuit according to claim 1,
wherein the second delay unit in each of the plurality of delay buffers includes a plurality of the second delay units,
wherein the fixed control voltage generator circuit supplies respective fixed control voltages to the plurality of second delay units, and
wherein a variable delay range of the plurality of serially connected delay buffers by means of the variable control voltage is controlled to a different variable delay range according to the combination of the plurality of fixed control voltages.

6. The delay circuit according to claim 5,
wherein the fixed control voltage generator circuit generates a high voltage or a low voltage as the fixed control voltages, according to the control code.

7. The delay circuit according to claim 5,
wherein the fixed control voltage generator circuit generates three or more kinds of voltages as the fixed control voltages, according to the control code.

8. The delay circuit according to claim 1,
wherein the fixed control voltage generator circuit generates a plurality of voltages as the fixed control voltages, according to a control code.

\* \* \* \* \*